(12) United States Patent
Morisada et al.

(10) Patent No.: US 7,410,915 B2
(45) Date of Patent: Aug. 12, 2008

(54) METHOD OF FORMING CARBON POLYMER FILM USING PLASMA CVD

(75) Inventors: Yoshinori Morisada, Tama (JP); Kamal Kishore Goundar, Tama (JP); Masashi Yamaguchi, Tama (JP); Nobuo Matsuki, Tama (JP); Kyu Tae Na, Hwasung (KR); Eun Kyung Baek, Hwasung (KR)

(73) Assignees: ASM Japan K.K., Tokyo (JP); Samsung Electronic Co., Ltd., Suwon-si (KR)

( * ) Notice: Subject to any disclaimer, the term of this patent is extended or adjusted under 35 U.S.C. 154(b) by 324 days.

(21) Appl. No.: 11/387,527

(22) Filed: Mar. 23, 2006

(65) Prior Publication Data
US 2007/0224833 A1    Sep. 27, 2007

(51) Int. Cl.
*H01L 21/469* (2006.01)
*H01L 23/58* (2006.01)

(52) U.S. Cl. ........................ 438/780; 257/643
(58) Field of Classification Search ............... 438/623, 438/765, 780, 952, 790, 794; 257/642–643
See application file for complete search history.

(56) References Cited

U.S. PATENT DOCUMENTS

| | | | |
|---|---|---|---|
| 4,921,724 A * | 5/1990 | Hubert et al. | 427/571 |
| 5,470,661 A | 11/1995 | Bailey et al. | |
| 6,428,894 B1 * | 8/2002 | Babich et al. | 428/408 |

OTHER PUBLICATIONS

U.S. Appl. No. 11/172,031, filed Jun. 30, 2005, Nobuo Matsuki, et al.

* cited by examiner

*Primary Examiner*—Calvin Lee
(74) *Attorney, Agent, or Firm*—Knobbe, Martens, Olson & Bear LLP

(57) ABSTRACT

A method of forming a hydrocarbon-containing polymer film on a semiconductor substrate by a capacitively-coupled plasma CVD apparatus. The method includes the steps of: vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. which is not substituted by a vinyl group or an acetylene group; introducing the vaporized gas and $CO_2$ gas or $H_2$ gas into a CVD reaction chamber inside which a substrate is placed; and forming a hydrocarbon-containing polymer film on the substrate by plasma polymerization of the gas, thereby reducing extinction coefficient (k) at 193 nm and increasing mechanical hardness.

40 Claims, 5 Drawing Sheets

METHOD OF FORMING CARBON POLYMER FILM USING PLASMA CVD

BACKGROUND OF THE INVENTION

1. Field of the Invention

The present invention relates to a method of forming a carbon polymer film by plasma CVD using a hydrocarbon-containing material having high molecular weight, and more particularly to a method of utilizing the carbon polymer film as a hard mask for semiconductor processing.

2. Description of the Related Art

In semiconductor processing techniques, optical films such as antireflective films and hard masks are used. In conventional techniques, these films are formed mainly by a technique called a coating method. The coating method forms highly functional polymer films by coating a liquid material and sintering it. It is, however, difficult to form a thin film on a substrate because a liquid having viscosity is coated. As semiconductor chip sizes continue to shrink, more thinned and higher-strength films are required.

As an advantageous method for achieving thinner films, use of a DLC diamond-like carbon film or an amorphous carbon film by plasma CVD has been reported (e.g., U.S. Pat. No. 5,470,661, U.S. Pat. No. 6,428,894). In these cases, using a molecule which is gaseous at room temperature as a material, a diamond-like carbon film or an amorphous carbonous film is formed by decomposing the molecule by plasma. Using a plasma CVD method gives promise of facilitating to achieve thinner films.

SUMMARY OF THE INVENTION

An embodiment of the present invention includes a method of forming a polymer film capable of having a wide variety of structures, which is an advantage of a coating method by plasma CVD, and using the thin polymer film formed as a hard mask for semiconductor processing. Polymer materials produced from organic monomers having high molecular weight such as benzene actualize a wide variety of structures and characteristics and are widely and industrially used as high-strength materials and various highly-functional materials. By plasma polymerizing these organic monomers by including them in reaction gas as a source gas especially in combination with an additive gas of $CO_2$ or $H_2$, it becomes possible to form a thin-film hard mask having excellent characteristics including optical properties and/or mechanical properties so that the thin-film hard mask can reduce reflectivity in combination with an anti-reflective layer if any or can eliminate an anti-reflective layer during an exposure step and can improve etching selectivity. Optionally, by controlling the temperature of the substrate at about 400° C. or higher, the mechanical properties and optical properties can further improve.

The above properties are important especially to a hard mask. A photoresist may be formed on the hard mask, and when the photoresist is exposed and patterned, the optical properties of the hard mask can affect the exposure and patterning processes. For example, when the extinction coefficient (k) of the hard mask is low at a wavelength of light used for exposure of the photoresist (i.e., more light can pass through the hard mask), reflectivity of the hard mask can be significantly reduced in combination with an anti-reflective layer or an anti-reflection layer can be eliminated. In cases where a hard mask is used for processing a substrate having a DRAM half pitch of 65 nm, exposure light having a wavelength of 193 nm may be used. Thus, extinction coefficient (k) at 193 nm is important.

Further, the mechanical properties are important especially to a hard mask. In the above, when pattern width becomes extremely small, the pattern is apt to be bent mechanically or thermally. If the mechanical hardness of a hard mask is high, the patterns can be more secured. Additionally, if the mechanical strength of the hard mask is high, etching selectivity of the hard mask over oxide films, for example, becomes high, and the hard mask can be thin, thereby inhibiting bending of the patterns.

By plasma polymerizing these organic monomers by including them in reaction gas as a source gas especially in combination with an additive gas of $CO_2$ or $H_2$, it becomes possible to reduce extinction coefficient (k) particularly measured at 193 nm (interestingly, not at 633 nm) and increase mechanical hardness. Preferably, an extinction coefficient at 193 nm and a mechanical hardness of the forming hydrocarbon-containing polymer film may be controlled at about 0.38 or less (preferably 0.35 or less) and about 0.5 GPa or higher (preferably 0.8 or higher), respectively. In embodiments of the present invention, refractive index (n) and elastic modulus can also increase (e.g., 1.45 or more at 193 nm and 5.20 GPa or more, respectively). Extinction coefficient (k) and refractive index (n) are wavelength-dependent. Interestingly, these properties can be controlled as a function of a flow rate of the $CO_2$ gas or $H_2$ gas and optionally as a function of the temperature of the substrate.

Additionally, in an embodiment, a liquid organic monomer is a hydrocarbon-containing monomer with carbon number five or more, which is not substituted by a vinyl group or an acetylene group. Additionally, according to an embodiment, a carbon polymer film is formed on a semiconductor device substrate and its intended use is no object.

According to still an embodiment of the present invention, a liquid organic monomer may not be substituted by a vinyl group or an acetylene group; for example, an organic polymer film can be formed from benzene substituted by a methyl group or an ethyl group.

Additionally, in an embodiment of the present invention, a liquid organic monomer is composed of hydrocarbon only and does not contain oxygen, silicon, fluorine, nitrogen, etc. Additionally, in an embodiment, a reaction gas is composed of an inert gas and an additive gas in addition to a liquid organic monomer. In an embodiment, a reaction gas is composed of a liquid organic monomer only. Further, in an embodiment, a reaction gas is composed of a liquid organic monomer and an inert gas. Still in an embodiment, a reaction gas is composed of a liquid organic monomer and an additive gas. Additionally, linking liquid organic monomers, an additive gas may become a main structure of a hydrocarbon-containing polymer film.

Because most of monomers having high molecular weight have low vapor pressure and are liquid at room temperature, they need to be vaporized in order to introduce them into a reaction chamber. In an embodiment of the present invention, use of liquid monomers is made it possible by preventing monomers from recondensing by providing a heater/vaporizer for vaporizing liquid monomers, and heating and keeping gas piping from the vaporizer to a reactor and a shower plate inside a reaction space at a given temperature.

Further according to an embodiment of the present invention, after being introduced into a reactor, organic monomers are polymerized by a polymerization reaction by plasma to make it possible to form an organic carbon polymer film on a substrate surface, and it becomes possible to use the film formed as a hard mask for semiconductor processing. A carbon polymer film formed by plasma CVD has excellent characteristics as an optical film because it facilitates to form a thin film having transparency.

When organic monomers are polymerized, $CO_2$ gas or $H_2$ gas is effectively introduced as an additive gas, and in an embodiment, the flow rate of the $CO_2$ gas or $H_2$ gas may be greater (e.g., 1.1 times, 1.5 times, 2 times, 5 times, 10 times, 20 times, 50 times, or 100 times greater) than a flow rate of the vaporized gas (or ranges between any two numbers of the foregoing can be employed). The upper limit may be set in view of conditions of plasma which becomes unstable when the flow rate of the $CO_2$ gas or $H_2$ gas is too high. Although the improvements in the optical/mechanical properties are generally or substantially proportional to the flow rate of the $CO_2$ gas or $H_2$ gas, in another embodiment, the flow rate of the $CO_2$ gas or $H_2$ gas can be the same as or less than (e.g., $3/4$, $1/2$, or $1/4$ or less of) a flow rate of the vaporized gas (or ranges between any two numbers of the foregoing can be employed).

In an embodiment, the $CO_2$ gas may be used at a flow rate of 350 sccm or more (including 400 sccm, 500 sccm, 800 sccm, 1,000 sccm, 1,500 sccm, 2,000 sccm, 3,000 sccm, 3,500 sccm, 4,000 sccm, or ranges between any two numbers of the foregoing).

In an embodiment, the $H_2$ gas may be used at a flow rate of 200 sccm or more (including 250 sccm, 300 sccm, 500 sccm, 1,000 sccm, or ranges between any two numbers of the foregoing).

In an embodiment, the temperature of the substrate may be controlled at about 0° C. to about 750° C., about 50° C. to about 650° C., about 350° C. to about 650° C., about 400° C. to 600° C., or ranges between any two numbers of the foregoing (either including or excluding the numbers).

The present invention is not limited to the above-mentioned advantages, objects or embodiments. In the present invention, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

Figures are referred to when preferred embodiments of the present invention are described, but the present invention is not limited to these figures and embodiments. Further, the drawings are oversimplified for illustrative purposes and are not intended to limit the present invention.

DETAILED DESCRIPTION OF THE PREFERRED EMBODIMENT

Figure 1:
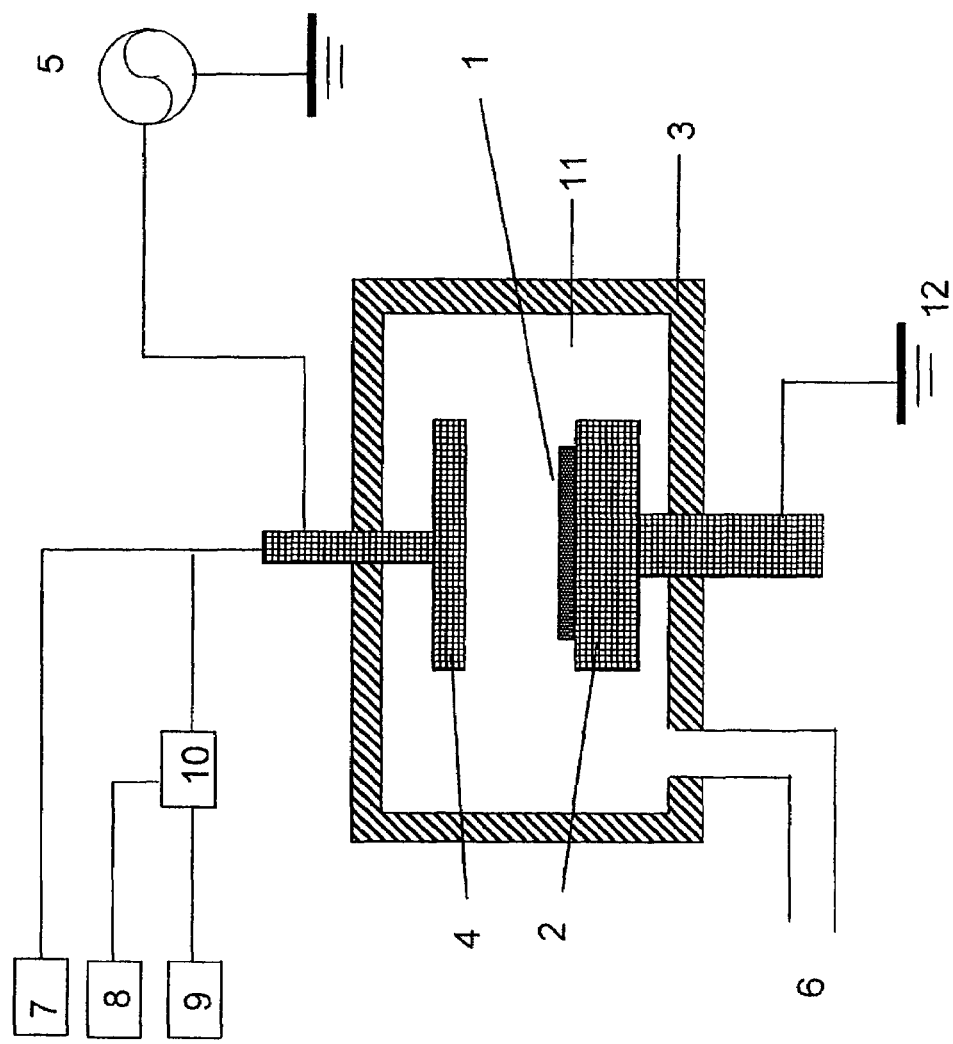
FIG. 1 is a schematic view showing an example of a CVD apparatus which can be used in an embodiment of the present invention.

The present invention is described in detail using preferred embodiments. The present invention, however, is not limited to these embodiments. Additionally, a requirement in an embodiment is freely applicable to other embodiments, and requirements are mutually replaceable unless special conditions are attached.

According to an embodiment, in a method of forming a hydrocarbon-containing polymer film on a semiconductor substrate by a capacitively-coupled plasma CVD apparatus, the present invention provides the above-mentioned method which comprises the steps of vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O or N) having a boiling point of 20° C.-350° C. which is not substituted by a vinyl group or an acetylene group, introducing the vaporized gas into a CVD reaction chamber inside which a substrate is placed, and forming a hydrocarbon-containing polymer film on the substrate by plasma polymerizing the gas. The substrate is, for example, a semiconductor device substrate.

Additionally, according to another embodiment, in a method of forming a hydrocarbon-containing polymer film on a semiconductor substrate by a capacitively-coupled plasma CVD apparatus, the present invention provides the above-mentioned method which comprises the steps of placing a semiconductor device substrate inside a CVD reaction chamber, vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O or N, F) having a boiling point of 20° C. to 350° C. which is not substituted by a vinyl group or an acetylene group, introducing the vaporized gas into the CVD reaction chamber inside which the substrate is placed, and forming a hard mask composed of a hydrocarbon-containing polymer film on the substrate by plasma polymerizing the gas.

Further, according to still another embodiment, in a method of forming a hydrocarbon-containing polymer film on a semiconductor substrate by a capacitively-coupled plasma CVD apparatus, the present invention provides the above-mentioned method which comprises the steps of introducing a hydrocarbon-containing liquid monomer ($C_\alpha H_\beta X_\gamma$, wherein $\alpha$ and $\beta$ are natural numbers of 5 or more; $\gamma$ is an integer including zero; X is O or N, F) having a boiling point of 20° C. to 350° C. into a heater through a flow control valve, and further through a shutoff valve provided downstream of the flow control valve and kept at approximately 80° C. or lower and vaporizing it, introducing the vaporized gas into the CVD reaction chamber inside which the substrate is placed, and forming a hydrocarbon-containing polymer film on the substrate by plasma polymerizing the gas. Additionally, the liquid monomer may be mixed with an inert gas downstream of the shutoff valve and upstream of the heater; additionally, after film formation is completed, a step of blocking inflow of the liquid monomer to the heater by shutting off the shutoff valve may be included. Additionally, after the shutoff valve is shut off, inside the heater may be purged by an inert gas.

In one or more than one of the above-mentioned embodiments, the liquid monomer may be introduced into a heater disposed upstream of the reaction chamber and vaporized.

Additionally, the liquid monomer may be flow-controlled by a valve upstream of the heater, and introduction of the liquid monomer into the heater may be blocked by a shutoff valve disposed between the flow control valve and the heater and kept at 80° C. or lower or at a temperature lower than that of heating/vaporization by approximately 50° C. or more except when a film is formed. Or, the liquid monomer may be flow-controlled by a valve disposed upstream of the heater and kept at 80° C. or lower or at a temperature lower than that of heating/vaporization by approximately 50° C. or more, and at the same time introduction of the liquid monomer into the heater may be blocked except when a film is formed.

In embodiments using any one of the above-mentioned valves as well, the liquid monomer may be mixed with an inert gas downstream of the valve and upstream of the heater.

Additionally, in one or more of the above-mentioned embodiments, a step of introducing an inert gas may be performed before the plasma polymerization.

Apparatus Configuration

FIG. 1 is a schematic view of an apparatus combining a vaporizer and a plasma CVD reactor, which can be used in the present invention. An apparatus which can be used in the present invention is not limited to an example shown in FIG. 1.

In this example, by providing a pair of electrically conductive flat-plate electrodes 4, 2 in parallel and facing each other inside a reaction chamber 11, applying RF power 5 to one side, and electrically grounding 12 the other side, plasma is excited between the electrodes. A temperature regulator is provided in a lower stage 2, and a temperature is kept constantly at a given temperature in the range of 0° C.-650° C. to regulate a temperature of a substrate 1 placed thereon. An upper electrode 4 serves as a shower plate as well, and reaction gas is introduced into the reaction chamber 11 through the shower plate. Additionally, in the reaction chamber 11, an exhaust pipe 6 is provided through which gas inside the reaction chamber 11 is exhausted.

Figure 2:
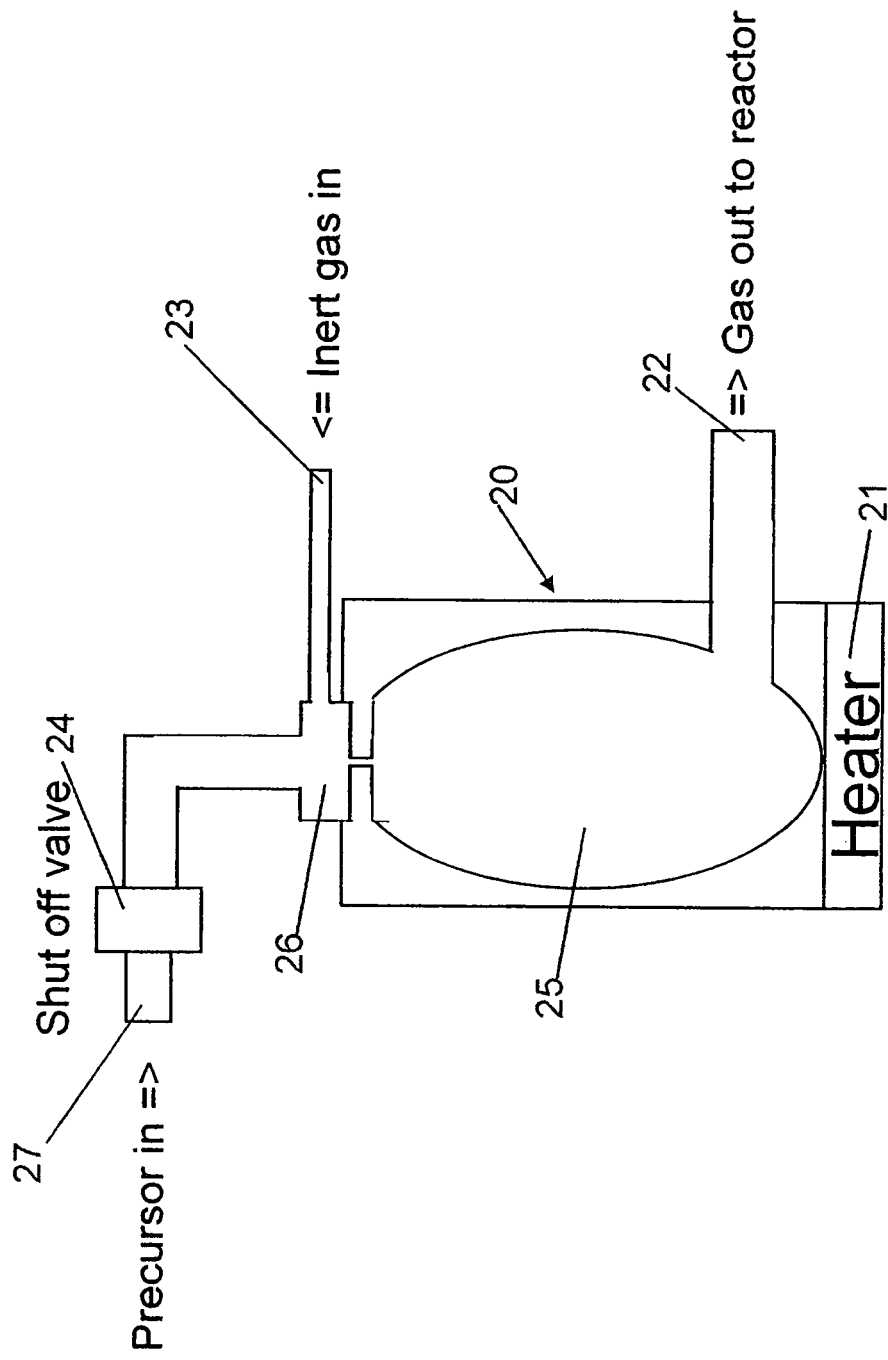
FIG. 2 is a schematic view showing an example of a heater/vaporizer which can be used in an embodiment of the present invention.

A vaporizer 10 (one example is shown in FIG. 2) which vaporizes a liquid organic monomer has an inlet port for a liquid and an inlet port for an inert gas in an embodiment and comprises a mixing unit for mixing these gases and a unit for heating the mixture. In the embodiment shown in FIG. 1, an inert gas is introduced from an inert gas flow-controller 8 to the vaporizer 10; and a liquid monomer is introduced from a liquid monomer flow-controller 9 into the vaporizer 10. A heating temperature for the mixture is determined by a vapor pressure characteristic of the liquid monomer; in an embodiment, a temperature is kept in the range of 30° C.-350° C. Vaporized gas is introduced into the reactor through gas piping. Additionally, the embodiment shown in FIG. 1 is designed to be able to introduce an additive gas from a gas flow-controller 7 into the reactor. Additionally, an inert gas can also be introduced into the reactor without passing through the vaporizer 10. The number of the gas flow-controller 7 is not limited to one, but can be provided appropriately to meet the number of gas types used.

The piping introducing the gas from the vaporizer to the reactor and a showerhead unit in an upper portion of the reactor are heated/temperature-controlled at a given temperature in the range of 30° C.-350° C. by a heater and their outer side is covered by an insulating material.

Liquid Organic Monomer

As a liquid organic monomer used in an embodiment of the present invention as a source gas, a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of room temperature or higher (e.g., 20° C.-350° C.) which is not substituted by a vinyl group or an acetylene group. Preferably, the carbon number is 6-30; in an embodiment, the carbon number is 6-12. Additionally, a boiling point is preferably approximately 30° C.—approximately 350° C.; in another embodiment, it is approximately 50° C.—approximately 200° C.; and in still another embodiment, it is approximately 100° C. or higher. The liquid monomer is cyclic hydrocarbon in an embodiment. The cyclic hydrocarbon may be substituted or non-substituted benzene. Further, the substituted or non-substituted benzene may be $C_6H_{6-n}R_n$ (wherein n, 0, 1, 2, 3); R may be independently —CH3 or —C2H5. In an embodiment, the liquid monomer is a combination of two types or more of substituted or non-substituted benzene.

In the above, the substituted benzene may be any one of 1.3.5-trimethylbenzene, o-xylene, m-xylene or p-xylene; in addition to a benzene derivative, the cyclic hydrocarbon may be any one of cyclohexane, cyclohexene, cyclohexadiene, cyclooctatetraene, pentane, iso-pentane, or neo-pentane. In an embodiment, the liquid monomer may be linear hydrocarbon, and the linear hydrocarbon may also be hexane.

Additionally, in an embodiment, the liquid monomer hydrocarbon wherein $\gamma$ is equal to zero. In an embodiment, a reaction gas may be composed of only the liquid monomer.

As a specific example, C6H3(CH3)3 (1.3.5-trimethylbenzene (TMB); boiling point of 165° C.) or C6H4(CH3)2 (dimethylbenzene (xylene); boiling point of 144° C.) can be mentioned. In addition to the above, as liner alkane ($C_nH_{2(n+1)}$), pentane (boiling point of 36.1° C.), iso-pentane (boiling point of 27.9° C.) or neo-pentane (boiling point of 9.5° C.), wherein n is 5, or hexane (boiling point: 68.7° C.), wherein n is 6 can be used as a source gas.

Additionally, in another embodiment, a liquid organic monomer is a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of room temperature or higher (e.g., approximately 20° C.—approximately 350° C.). Using this monomer, a hard mask is formed. Preferably, the carbon number is 6-30; the carbon number is 6-12 in an embodiment. A boiling point is preferably approximately 30° C. to approximately 350° C.; it is 50° C. to approximately 350° C. in an embodiment; approximately 50° C. to approximately 200° C. in an embodiment, or approximately 100° C. or higher in an embodiment. In this case as well, the liquid monomer is cyclic hydrocarbon, and the cyclic hydrocarbon may also be substituted or non-substituted benzene. Further, the substituted benzene or the non-substituted benzene may be $C_6H_{6-n}R_n$ (wherein n is 0, 1, 2, or 3); R may be independently —CH3, —C2H5, or —CH=CH2. Additionally, in an embodiment, the liquid monomer is a combination of two types or more of the non-substituted benzene.

In the above, the substituted benzene may be any one of 1.3.5-trimethylbenzene, o-xylene, m-xylene, or p-xylene; In addition to benzene derivatives, the cyclic hydrocarbon may be any one of cyclohexene, cyclohexadiene, cyclooctatetraene, pentane, iso-pentane, or neo-pentane. Additionally, it may be linear hydrocarbon; the linear hydrocarbon may be pentane, iso-pentane, neo-pentane, hexane, 1-pentene, 1-hexene, or 1-pentyne.

Additionally, in an embodiment, the liquid monomer is hydrocarbon wherein $\gamma$ is equal to zero. In an embodiment, a reaction gas composed of only the liquid monomer may be used.

Specifically, C6H5(CH=CH2) (Vinylbenzene (Styrene); boiling point of 145° C.) can be mentioned. In addition to this, as liner alkene (CnHn (n=5)), 1-Pentene (boiling point of 30.0° C.); or as liner alkyne ($CnH_{2(n-1)}$ (n=5), 1-Pentyne (boiling point of 40.2° C.), etc. can be used as a source gas.

Monomer Vaporization

A liquid monomer is a monomer which is liquid at room temperature. Depending on a structure and a boiling point of a liquid monomer, however, a means for preventing polymerization of the liquid monomer in a liquid phase from taking place is required.

When an organic monomer such as benzene and toluene having a boiling point (under one atmosphere) of 150° C. or lower and high vapor pressure, and not having a reactive group containing an unsaturated bond is used, because a polymerization phenomena and the like inside a vaporizer does not cause a problem, use of a method in which the liquid monomer is stored in a tank in advance, the tank storing the liquid monomer is heated, and gas vaporized by heating the tank is flow-controlled and supplied to a reactor is possible. In this case, there are both cases of introducing and not introducing an inert gas into a vaporizer.

When an organic monomer having a boiling point of 150° C. or more and low vapor pressure is used, and if the method of heating the tank is used, problems such as a phenomena which molecular weight of the liquid monomer is changed by a polymerization reaction taking place inside the tank, and caking because a monomer in a liquid phase is kept at a high temperature for a long time, occur. Because of this, by using a type of vaporizer which introduces a given flow rate of a liquid monomer equivalent to that of a monomer gas introduced into a reactor by a flow control unit into the vaporizer, the liquid monomer is heated and vaporized in a short time. In this case, there are both cases of introducing and of not introducing an inert gas into the vaporizer.

Additionally, particularly when a monomer having a boiling point of 170° C. or higher and low vapor pressure or a reactive group containing an unsaturated group such as a vinyl group is used, a means for preventing polymerization from taking place inside a vaporizer is required. In this case, there are both cases of introducing and of not introducing an inert gas into a vaporizer; but preferably an inert gas is introduced.

During film formation, a liquid monomer is constantly supplied into a vaporizer and is not heated and kept in a liquid phase for a long time. However, after the film formation is completed and between carrying out of a substrate on which a thin film has been formed and placing a next substrate inside a reactor, it is necessary to stop introducing the liquid monomer because the monomer is not supplied to the reactor. During this, the liquid monomer stays in a heater portion inside the vaporizer, and a polymerization reaction takes place inside the vaporizer.

In order to solve this problem, a function for shutting off liquid monomer supply is added upstream of a vaporizer portion so that liquid monomer penetration into the heater/vaporizer portion is prevented while the monomer is not supplied to the reactor. One example of embodiments is that a flow control portion is kept away from the heater/vaporizer portion to maintain a low temperature, and a function for shutting off liquid monomer supply is added to the flow control portion or a valve for shutting off liquid monomer penetration is provided in the flow control portion. An embodiment is shown in FIG. 2.

An inert gas is flow-controlled in the flow control unit (not shown) and the inert gas at a given flow rate is introduced from an inlet pipe 23 to a vaporizer 20. A precursor (liquid monomer) and the inert gas respectively are brought from respective inlet ports into a mixing unit 26 and are mixed, and a mixed gas is vaporized in a heater/vaporizer unit 25. The vaporized gas is sent into a reaction chamber via gas piping 22. A vaporization temperature of the mixed gas is determined by a vapor pressure characteristic of the liquid monomer, and controlled normally at a temperature in the range of 30° C.-350° C. A heater 21 is provided in the vaporizer.

In this vaporizer, a shutoff valve 24 is provided upstream of the mixing unit 26. The precursor is sent into the mixing unit 26 after going through the flow control unit (not shown) and the shutoff valve 24 through an inlet pipe 27. The shutoff valve 24 is temperature-controlled and is kept normally at approximately 80° C. or lower, or at a temperature which is lower than that of the heater/vaporizer unit 25 by approximately 50° C. or more (heating control, cooling control). When a temperature of the heater/vaporizer unit 25 is at 100° C. or lower, there is not much need to give consideration to a temperature of the shutoff valve. Additionally, even when a temperature of the heater/vaporizer unit 25 is at 100° C. or higher, the shutoff valve is naturally cooled without controlling a temperature if designed to be distanced from a high-temperature portion (i.e., temperature control in a broad sense). The shutoff valve 24 is closed during the film formation so as not to allow a liquid monomer to be introduced into the heater/vaporizer unit 25.

Although a liquid monomer is held upstream of the shutoff valve 24, it is difficult to cause a polymerization reaction while the liquid monomer is held by the shutoff valve 24 because a temperature of the shutoff valve 24 is kept at approximately 80° C. or lower, or at a temperature approximately 50° C. lower than that of the heater/vaporizer unit 25. Consequently, a temperature of the shutoff valve is sufficient as long as it does not cause a polymerization reaction of a liquid monomer while preserved, and which can be appropriately selected according to polymerization characteristics of a liquid monomer. Additionally, when a liquid monomer having a low boiling point and high vapor pressure is used, control of the shutoff valve can be unnecessary. Additionally, even when a liquid monomer having a high boiling point and low vapor pressure is used, there may be cases where control of the shutoff valve is unnecessary because a polymerization reaction of a liquid monomer in a vaporizer does not much matter when film formation is completed in a short time.

Additionally, after the shutoff valve 24 is shut off, by continuously introducing the inert gas into the mixing unit 26 and the heater/vaporizer 25, inside the heater/vaporizer unit 25 can also be purged by the inert gas. By this, an amount of liquid monomer remaining inside the vaporizer and being on standby can be decreased, and an amount of liquid monomer which may cause a polymerization reaction can be minimized.

Additionally, a flow control function can be added to the shutoff valve; in this case, a separate flow control unit is not required or can be simplified.

In an embodiment which does not require the shutoff valve, a tank type heater/vaporizer or a nozzle type heater/vaporizer can be used (e.g., U.S. Pat. Nos. 6,277,201, 6,699,524, 5,377, 616). A nozzle type vaporizer can also be provided inside a reaction chamber.

Flow Rate and Other Conditions

A flow rate of liquid monomer is not particularly restricted, but as a flow rate introduced into a reaction chamber after vaporization, in an embodiment, it is approximately 30 sccm to approximately 1000 sccm (50 sccm, 100 sccm, 150 sccm, 200 sccm, 300 sccm, 400 sccm, 500 sccm, and including a range defined by any one of foregoing values).

Additionally, an inert gas can be introduced into a reaction chamber. For example, the inert gas can be one of or a combination of two or more of Ar, He, Ne, Kr, Xe, and $N_2$;

preferably Ar or/and He. A flow rate of an inert gas introduced into a reaction chamber is approximately 0 sccm to approximately 3000 sccm (30 sccm, 50 sccm, 100 sccm, 150 sccm, 200 sccm, 300 sccm, 500 sccm, 1000 sccm, 2000 sccm, and including a range defined by any one of foregoing values).

In an embodiment of the present invention, $CO_2$ gas or $H_2$ gas is introduced as described above. Additionally, in an embodiment, further as an additive gas, an organic gas CnHm (wherein n is an integer of 4 or less including zero; m is any natural number) can also be introduced into a reaction chamber. Or, further as an additive gas, a dry gas containing N, O, or F can also be introduced into a reaction chamber. Additionally, as a reducing gas, ammonia, carbon monoxide, etc. can also be used as an additive gas. A flow rate of an additive gas introduced into a reaction chamber is approximately 0 sccm to approximately 300 sccm (30 sccm, 50 sccm, 100 sccm, 150 sccm, 200 sccm, and including ranges defined by any two of foregoing values).

Consequently, in an embodiment, an organic carbon polymer film is formed using only a hydrocarbon-containing gas and an inert gas. Or, the film may be formed using only a hydrocarbon-containing gas. Additionally, only a hydrocarbon-containing gas and an inert gas, or a hydrocarbon-containing gas, an inert gas and an additive gas can be used.

Additionally, in an embodiment in which an inert gas is mixed in a heater/vaporizer, the inert gas may be introduced into a reaction chamber. Explanation of the above-mentioned inert gas to be introduced into the reaction chamber can apply to the inert gas as it is. In this case, in substitution for an inert gas introduced directly into the reaction chamber, an inert gas introduced through a vaporizer can be used. Additionally, an inert gas introduced directly into the reaction chamber and an inert gas introduced through the vaporizer can also be used together. In an embodiment, a flow rate of an inert gas introduced through the vaporizer is equal to or more than that of an inert gas introduced directly. Additionally, in an embodiment, the same type of inert gas is used for the one introduced through the vaporizer and the one introduced through the vaporizer; in another embodiment, different types of inert gases are used.

A plasma polymerization can be preformed in an embodiment under the conditions: a substrate temperature of approximately 0° C. to approximately 650° C. (including a range of 150° C.-450° C. and a range of 300° C.-400° C.), a reaction pressure of approximately 10 Pa—approximately 1500 Pa (including a range of 50 Pa-1000 Pa and a range of 100 Pa-500 Pa).

As to RF power density, a plasma polymerization step is preformed under the conditions of: RF power density of approximately 0.01 W/cm2—approximately 20 W/cm2 (per substrate area) (including a range of 0.05-10 W/cm2 and a range of 1-5 W/cm2 in an embodiment.

Power per unit monomer is changed under various other conditions; a plasma polymerization step can be performed under the condition of 0.01-100 W/sccm (including a range of 0.05-50 W/sccm and a range of 3-20 W/sccm) in an embodiment; RF power can also be controlled per monomer unit flow rate.

Additionally, a plasma polymerization step can be performed using a frequency exceeding 5 MHz, e.g., any one of high RF power frequency power of 13.56 MHz, 27 MHz or 60 MHz, in an embodiment; further, one of the foregoing high RF power frequency power and low RF power of 5 MHz or less (including 2 MHz or less and 500 kHz or less) can be combined. In an embodiment, a ratio of low RF power is 50% or less, 30% or less, or 10% or less of high RF power.

A thickness of an organic polymer can be appropriately selected according to intended uses. In an embodiment, it is 50 nm-1000 nm or 100 nm-500 nm. A deposition rate differs depending on a liquid monomer used; in an embodiment, it is approximately 0.1-20 nm/sec.

A carbon polymer film obtained differs depending on a liquid monomer used; in an embodiment, a modulus is in the range of approximately 4-10 GPa or approximately 5-8 GPa. Additionally, mechanical hardness is in the range of approximately 0.1-2 GPa or approximately 0.3-1 GPa.

Hard Mask Formation

Figure 4:
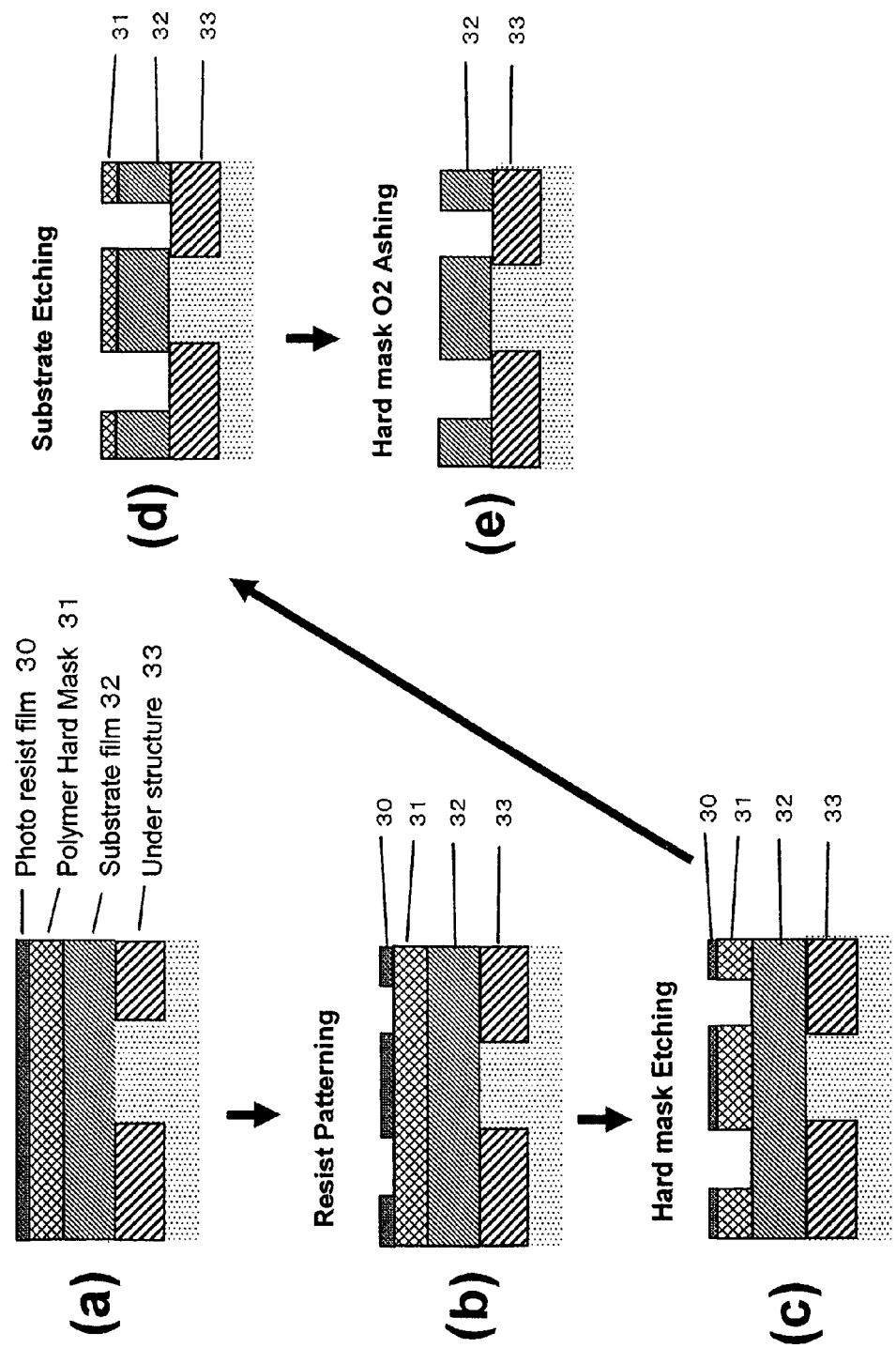
FIG. 4 is a process chart showing an example in which a hydrocarbon-containing polymer film formed in an embodiment of the present invention is used as a hard mask.

An example of hard mask formation and use is shown in FIG. 4. FIG. 4(a) is a schematic view of a structure of a semiconductor device substrate in which an organic carbon polymer film according to an embodiment of the present invention is formed as a hard mask. On an under structure 33 in which an electric circuit is formed, a substrate film 32 which is a dielectric film (Silicon oxide, SiOF, SiC, other low-dielectric-constant films, etc.), a capacitor material (SiN, $Al_2O_3$, $HfO_2$, $Ta_2O_3$, etc.), an electrode material, metal (Poly Si, TiN, TaN, Ru, Al, etc.), etc. is formed; on top of that, an organic carbon polymer film is formed as a hard mask 31. On top of that, a photo resist film 30 (photopolymer, etc.) is formed. Additionally, the present invention is not limited to this structure (e.g., DRAM). Further, a structure may be a film-laminated structure; a dielectric film may be a low-k film formed by a spin-on process (rotary coating).

In FIG. 4(b), the photo resist film 30 is etched into a given pattern; in FIG. 4(c), the hard mask 31 is etched; after that, in FIG. 4(d), the dielectric film 32 is etched; in FIG. 4(e), the finally remaining hard mask 31 is removed by O2 ashing, etc. By this, a dielectric film, etc. having a given pattern can be formed.

After-treatment

Additionally, after film formation on a substrate is completed, cleaning inner walls of a reaction chamber is desirable. For example, cleaning of a wall surface of the reaction chamber can be performed by introducing oxygen (O2) and/or a mixture gas of CxFy (x and y are any natural numbers respectively) and an inert gas into the reaction chamber and generating plasma between electrodes; after film formation on a substrate is completed, cleaning of a wall surface of the reaction chamber can be performed by introducing a gas containing radical molecules containing O, F into the reaction chamber; or after film formation on a substrate is completed, cleaning of a wall surface of the reaction chamber can be performed by introducing a gas containing radical molecules containing O, F into a reaction chamber, generating plasma between electrodes.

Additionally, after cleaning a wall surface of the reaction chamber is completed, by introducing a reducing gas and reducing radical molecules into the reaction chamber and generating plasma between electrodes, removing fluoride on the wall surface of the reaction chamber can also be performed.

Further, in order to improve mechanical strength of a film, heat curing of the film formed can be performed by combining UV and EB.

Experimental Results

Examples of the present invention are explained below, but the present invention is not limited to these examples.

Common conditions: Common conditions in respective examples are as follows: Eagle®10 (ASM Japan) possessing a basic structure shown in FIG. 1 was used as a reactor; a heater/vaporizer shown in FIG. 2 was used. Additionally, in the case of these examples, although a liquid monomer was flow-controlled by a flow control unit in a liquid phase, an amount of gas introduced into a reactor was obtained by molar conversion from the flow rate of the liquid. Further, in these examples, the substrate having a diameter of 200 mm was used. In the case of a substrate having a diameter of 300 mm, the common conditions indicated below can also be applied except that the gas flows and the RF power will need to be increased (approximately two times (e.g., 2.25 times) greater).

Reactor Settings
Temperature of upper electrode (shower plate): 180° C.
Size of shower plate: φ250 mm (Size of substrate: φ200 mm)
Substrate temperature: 390° C.
Temperature of vaporizer, vaporizer portion: 150° C.
Controlled temperature of gas inlet piping: 140° C.

COMPARATIVE EXAMPLE 1

No Additive Gas

Process conditions in this example and film formation results are shown as follows:
Gap between shower plate and susceptor: 16 mm
Process Conditions:
$C_6H_3(CH_3)_3$: 130 sccm
He supplied to vaporizer: 170 sccm
Process gas He supplied to reactor: 44 sccm
RF Power 13.56 MHz: 400 W
RF Power 400 kHz: 145 W
Pressure: 800 Pa
Film formation time: 29 sec
Film Formation Results:
Thickness: 200 nm
RI(n): 1.696 at 633 nm
RI(k): 0.018 at 633 nm
RI(n): 1.514 at 193 nm
RI(k): 0.391 at 193 nm
Modulus: 5.06 GPa
Mechanical Hardness: 0.422 GPa (Controllability of Thin Film Formation)

Figure 3:
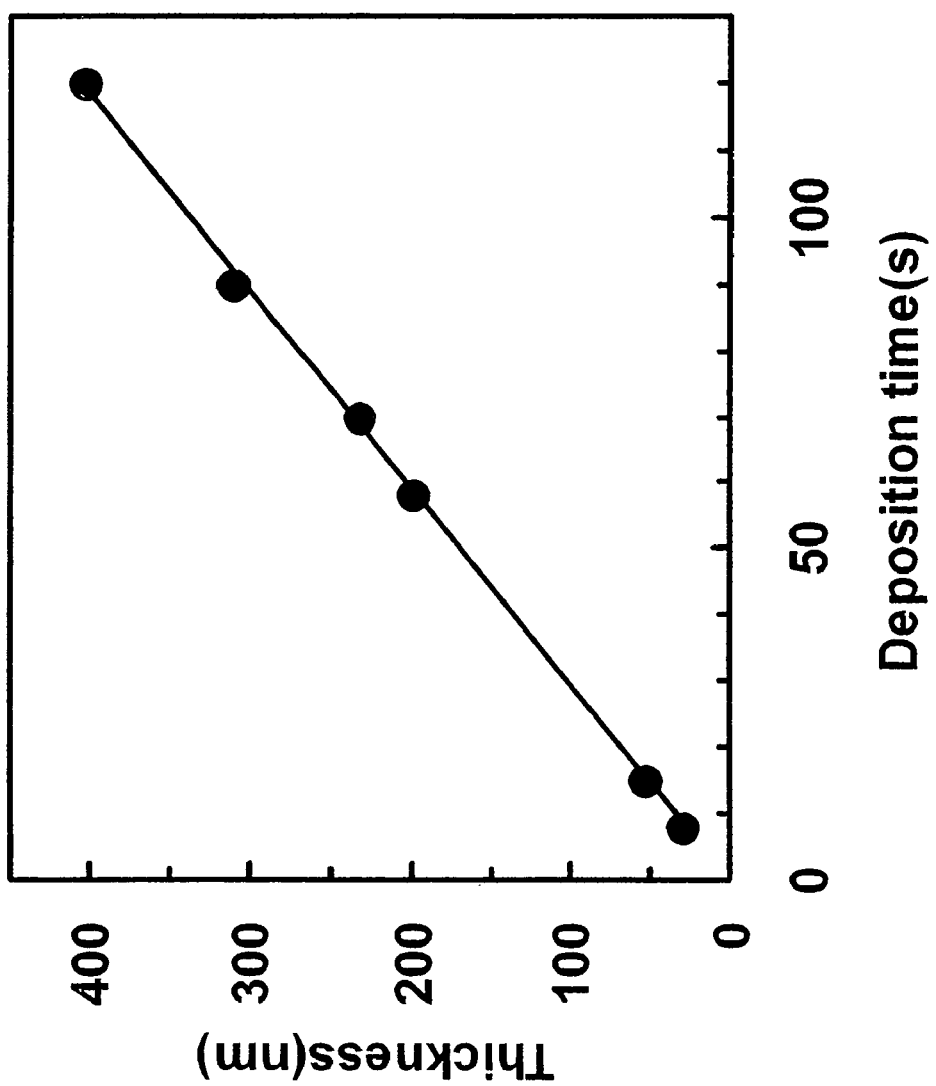
FIG. 3 is a graph showing an example of a relation between film formation time and a film thickness of a hydrocarbon-containing polymer film measured in an embodiment of the present invention.

Additionally, FIG. 3 shows relation of film formation time and a thickness of a film formed obtained under the same conditions as the above. A film thickness is proportional to the film formation time; it was confirmed that thin films having a thickness from approximately 30 nm to approximately 400 nm were formed with satisfactory controllability. Additionally, RI, modulus, mechanical hardness of carbon polymer films obtained were all satisfactory and it is seen that the carbon polymer films obtained are suitable for a hard mask.

In the above Comparative Example 1, no additive gas was used. The following Examples show that an additive gas especially $CO_2$ gas was useful for changing optical properties and mechanical properties. Further, the Examples also show that the changes of optical properties and mechanical properties were generally or substantially proportional to the flow rate of the additive gas. In particular, mechanical hardness of the resultant films increased (chemical structures became more complex and stronger), thereby improving etching selectivity (e.g., selectivity between an oxide film and a hard mask in a damascene process); and extinction coefficient (k) of the resultant films decreased, thereby reducing reflectivity in combination with anti-reflective layer (ARL) or eliminating the need for an ARL. Low extinction coefficient k at 193 nm is important in order to eliminate an ARL when a photo resist is exposed to a light beam of 193 nm.

EXAMPLE 1

$CO_2$: 3,000 sccm

Process conditions in this example and film formation results are shown as follows:
Gap between shower plate and susceptor: 16 mm
Process Conditions:
$C_6H_3(CH_3)_3$: 130 sccm
$CO_2$: 3,000 sccm
He supplied to vaporizer: 170 sccm
Process gas He supplied to reactor: 44 sccm
RF Power 13.56 MHz: 400 W
RF Power 400 kHz: 145 W
Pressure: 800 Pa
Film formation time: 42 sec
Film Formation Results:
Thickness: 200 nm
RI(n): 1.777 at 633 nm
RI(k): 0.075 at 633 nm
RI(n): 1.513 at 193 nm
RI(k): 0.244 at 193 nm
Modulus: 9.46 GPa
Mechanical Hardness: 1.288 GPa In the above Example, as compared with Comparative Example 1, refractive index (n) and extinction coefficient (k) at 633 nm increased from 1.690 and 0.018 to 1.777 and 0.075, respectively; however, at 193 nm, although refractive index (n) increased from 1.438 to 1.513, extinction coefficient (k) significantly decreased from 0.400 to 0.244. Also, both mechanical hardness and elastic modulus significantly increased from 0.42 GPa and 5.06 GPa to 1.29 GPa and 9.46 GPa, respectively. These phenomena are surprising because when mechanical hardness increases, density also increases, and thus refractive index (n) normally increases (more refraction can occur) and extinction coefficient (k) increases (less light passes through the film). However, when $CO_2$ is added as an additive gas, CO and/O derived from $CO_2$ promote crosslinking as a crosslinker at —$CH_2$, for example, present in film structures, thereby rendering its molecular structures more complex but interestingly decreasing the extinction coefficient (k) at 193 nm (more light passes through the film at 193 nm) while increasing the extinction coefficient (k) at 633 nm. This may be because the molecular structures of the film become more complex but more organized in a particular manner without significantly increasing its density. Note that the above theories or mechanisms are not intended to limit the present invention.

EXAMPLES 2 AND 3

$CO_2$: 370 sccm and 740 sccm

Process conditions in these examples were essentially the same as in Example 1 except for the flow rate of $CO_2$ and the deposition rate as shown in Table 1. Film formation results are also shown in Table 1.

As shown in Table 1, the above-described phenomena can be seen in these examples, which are generally or substantially proportional to the flow rate of $CO_2$.

COMPARATIVE EXAMPLE 2

$O_2$: 15 sccm

Process conditions in this example were essentially the same as in Example 1 except for the additive gas and its flow rate and the deposition rate as shown in Table 1. Film formation results are also shown in Table 1.

$O_2$ is an oxidizing gas, and $CO_2$ also has oxidizing effect. Thus, the use of $O_2$ provided phenomena similar to those of $CO_2$ as shown in Table 1. However, the degree of improvements in terms of mechanical hardness and extinction coefficient (k) at 193 nm are not as good as in Examples 1-3. The mechanical hardness was less than 0.5 GPa and the extinction coefficient at 193 nm was more than 0.38. Further, it is difficult to increase the flow rate of $O_2$ because a plasma becomes unstable.

EXAMPLE 4

$H_2$: 200 sccm

Process conditions in this example was essentially the same as in Example 1 except that $H_2$ was used at 200 sccm as an additive gas instead of $CO_2$ and the film formation time was 24 seconds (the deposition rate was 495 nm/min). Film formation results are shown in Table 1.

As shown in Table 1, by using $H_2$ as an additive gas at 200 sccm, refractive index (n). and extinction coefficient (k) at 633 nm increased, whereas refractive index (n) and extinction coefficient (k) at 193 nm decreased. Interestingly, these phenomena are slightly different from those in Examples 1-3. Mechanical hardness increased. When $H_2$ is added as an additive gas, H derived from $H_2$ forms an H-terminal in —$CH_2$ or promotes crosslinking as a reduction agent at —$CH_2$, for example, present in film structures, thereby rendering its molecular structures more complex but interestingly decreasing the extinction coefficient (k) (more light passes through the film). This may be because the molecular structures become more complex but more organized in a particular manner (different from that in the case of $CO_2$) without significantly increasing its density. Note that the above theories or mechanisms are not intended to limit the present invention.

COMPARATIVE EXAMPLE 3

Temperature: 500° C. without Additive Gas

Process conditions in this example were essentially the same as in Example 1 except that the temperature of the substrate was 500° C. and no additive gas was used. Film formation results are shown in Table 1.

As shown in Table 1, when the temperature of the substrate was high, mechanical strength of a film increased, and its extinction coefficient (k) and refractive index (n) increased except for refractive index (n) at 193 nm. Additionally, the density of the film also increased. This may be because weak bonds which would have been present in the film had the temperature been low were decomposed by thermal energy at the high temperature, thereby forming stronger bonds and increasing the density and refractive index (n). This may also be because bonds including hydrogen (such as —$CH_3$) which would have been incorporated in the film had the temperature been low were disassociated at the high temperature, thereby increasing the carbon content and increasing refractive index (n).

As shown in Table 1, although the high temperature deposition has disadvantages such as an increase of extinction coefficient (k), it can increase mechanical strength and etching selectivity without rendering a plasma unstable (a significantly high flow rate of $CO_2$ or $H_2$ may render a plasma unstable).

EXAMPLE 5

Temperature: 450° C. with $CO_2$: 3,000 sccm

Process conditions in this example were essentially the same as in Example 1 except that the temperature of the substrate was 450° C. Film formation results are shown in Table 1.

As shown in Table 1, when the $CO_2$ flow rate was high at the high temperature, mechanical strength of a film significantly increased (the highest among the examples), and extinction coefficient (k) at 193 nm decreased as compared with those in Comparative Example 1. Although the extinction coefficient (k) at 193 nm slightly higher than in Example 1, its value is still significantly lower than in Comparative Example 1. Incidentally, in this example, the temperature was set at 450° C., advantageous effects such as those shown in this example could be obtained at a temperature of about 400° C. or higher. As with this example, a combination of the high temperature deposition and the addition of $CO_2$ or $H_2$ can increase mechanical strength to a higher degree than that can be achieved by the addition of $CO_2$ or $H_2$ alone.

TABLE 1

| Process | Additive Gas Flow (sccm) | D/R (nm/min) | Optical Properties | | | | Mechanical Properties | |
|---|---|---|---|---|---|---|---|---|
| | | | 193 nm | | 633 nm | | E-Modulus (GPa) | Mechanical Hardness (GPa) |
| | | | n-value | k-value | n-value | k-value | | |
| Cont. | 0 | 420 | 1.438 | 0.400 | 1.690 | 0.018 | 5.06 | 0.42 |
| $O_2$ | 15 | 406 | 1.543 | 0.381 | 1.698 | 0.020 | 5.50 | 0.46 |
| $CO_2$ | 370 | 478 | 1.518 | 0.362 | 1.700 | 0.020 | 5.82 | 0.61 |
| $CO_2$ | 740 | 476 | 1.535 | 0.343 | 1.710 | 0.026 | 6.56 | 0.75 |
| $CO_2$ | 3000 | 291 | 1.513 | 0.244 | 1.777 | 0.075 | 9.46 | 1.29 |
| $H_2$ | 200 | 495 | 1.551 | 0.349 | 1.686 | 0.015 | 6.12 | 0.60 |
| 500° C. | 0 | 201 | 1.362 | 0.417 | 1.878 | 0.191 | 5.77 | 0.70 |
| $CO_2$ + 450° C. | 3000 | 127.7 | 1.368 | 0.3107 | 1.843 | 0.233 | 10.8 | 1.50 |

EXAMPLE 6

Relationship Between Mechanical Hardness/k-value and $CO_2$ Flow

Figure 5:
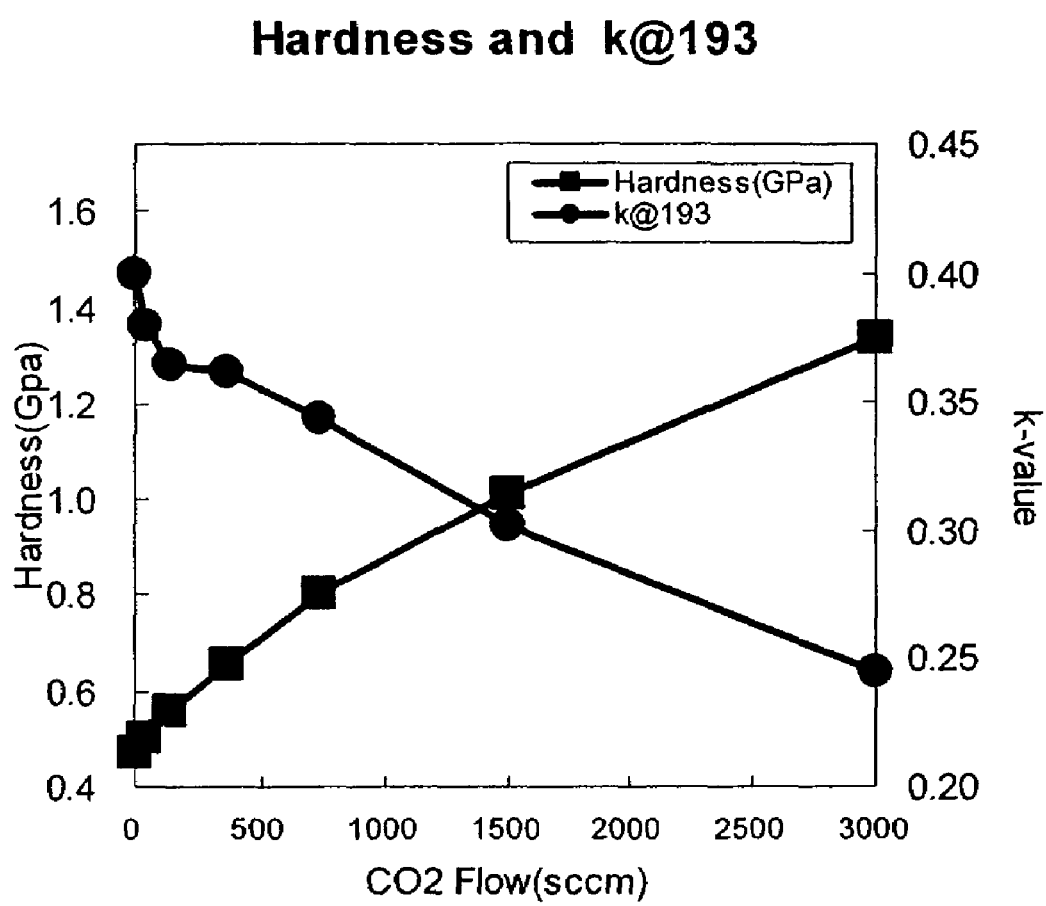
FIG. 5 is a graph showing a relationship between the mechanical hardness/extinction coefficient (k) and the flow rate of $CO_2$ according to embodiments of the present invention.

Process conditions in this example were essentially the same as in Example 1 except for the flow rate of $CO_2$ and the deposition rate as shown in Table 2. Film formation results are shown in FIG. 5. (Typically, the deposition rate may range preferably from about 150 nm/min to about 300 nm/min.)

TABLE 2

| $CO_2$ Flow (sccm) | Deposition Rate (nm/min) |
|---|---|
| 0 | 420.4 |
| 37 | 424.0 |
| 147 | 450.8 |
| 369 | 197.8 |
| 737 | 202.9 |
| 1,500 | 182.7 |
| 2,998 | 291.1 |

As shown in FIG. 5, interestingly, the higher the $CO_2$ flow, the lower the extinction coefficient (k) becomes, whereas the higher the $CO_2$ flow, the higher the mechanical hardness becomes. Further, when the $CO_2$ flow is about 800 sccm or higher, the extinction coefficient (k) at 193 nm is 0.35 or less, and the mechanical hardness is 0.8 GPa or higher. Thus, when using these films as a hard mask, the hard mask allows a light beam having a wavelength of 193 nm to effectively pass therethrough so that a photo resist can be processed more effectively with anti-reflective layer (ARL) or even without an ARL. Also, even if pattern width becomes narrow, the hard mask having sufficient mechanical strength can be sustained during fabrication processes.

INDUSTRIAL APPLICABILITY

According to at least one embodiment of the present invention, it becomes possible to form a polymer hard mask film by plasma CVD and processing of microscopic highly-integrated next-generation semiconductor devices is facilitated. At the same time, it becomes possible to supply reliable semiconductors inexpensively.

As described above, the present invention includes at least the following embodiments:

1) A method of forming a hydrocarbon-containing polymer film on a semiconductor substrate by a capacitively-coupled plasma CVD apparatus, which comprises the steps of: vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. which is not substituted by a vinyl group or an acetylene group, introducing the vaporized gas and an oxidizing gas such as $CO_2$ gas or an reducing gas such as $H_2$ gas into a CVD reaction chamber inside which a substrate is placed, forming a hydrocarbon-containing polymer film on the substrate by plasma polymerizing the gas, and optionally controlling a temperature of the substrate at e.g., about 400° C. or higher while the film is depositing on the substrate.

2) The method described in 1) above, wherein the liquid monomer is cyclic hydrocarbon.

3) The method described in 2) above, wherein the cyclic hydrocarbon is substituted or non-substituted benzene.

4) The method described in 3) above, wherein the substituted or non-substituted benzene is $C_6H_{6-n}R_n$ (wherein n is 0, 1, 2, or 3); R is independently —CH3 or —C2H5.

5) The method described in 4) above, wherein the liquid monomer is a combination of two types or more of substituted or non-substituted benzene.

6) The method described in 4) above, wherein the substituted benzene is any one of 1.3.5-trimethylbenzene, o-xylene, m-xylene or p-xylene.

7) The method described in 2) above, wherein the cyclic hydrocarbon is any one of cyclohexane, cyclohexene, cyclohexadiene, cyclooctatetraene, pentane, iso-pentane, or neopentane.

8) The method described in 1) above, wherein the liquid monomer is linear hydrocarbon.

9) The method described in 8) above, wherein the linear hydrocarbon is hexane.

10) The method described in 1) above, wherein the liquid monomer is hydrocarbon wherein $\gamma$ is equal to zero.

11) The method described in 1) above, wherein only the liquid monomer is used as a reaction gas.

12) The method described in 1) above, wherein the liquid monomer is introduced into a heater disposed upstream of the reaction chamber and vaporized.

13) The method described in 12) above, wherein the liquid monomer is flow-controlled upstream of the heater by a valve, and its introduction into the heater is blocked by a shutoff valve disposed between the flow control valve and the heater and kept approximately at 80° C. or lower or at a temperature lower than that of heating/vaporization by approximately 50° C. or more except when a film is being formed.

14) The method described in 12) above, wherein the liquid monomer is flow-controlled by a valve, which is disposed upstream of the heater and kept at approximately 80° C. or lower or at a temperature lower than that of heating/vaporization by approximately 50° C. or more, and its introduction into the heater is blocked except when a film is being formed.

15) The method described in 13) and 14) above, wherein the liquid monomer is mixed with an inert gas downstream of the valve and upstream of the heater.

16) The method described in 1) above, further comprising introducing an inert gas into the reaction chamber before the plasma polymerization.

17) The method described in 16) above, wherein the inert gas is one of or a combination of two or more of Ar, He, Ne, Kr, Xe and N2.

18) The method described in 1) above, wherein as an additive gas, an organic gas CnHm (wherein n is an integer of 4 or less including zero; m is any natural number) is further introduced into the reaction chamber.

19) The method described in 1) above, wherein as an additive gas, a dry gas containing N, O and F is further introduced into the reaction chamber.

20) The method described in 1) above, wherein the plasma polymerization is preformed under the conditions of a substrate temperature of approximately 0° C.—approximately 650° C., a reaction pressure of approximately 10 Pa—approximately 1500 Pa, RF power density of approximately 0.01 W/cm2—approximately 20 W/cm2.

21) The method described in 1) above, wherein the plasma polymerization step is preformed using high RF power of 13.56 MHz, 27 MHz, or 60 MHz.

22) The method described in 21) above, wherein one of the high RF power frequencies and a low RF power frequency of 5 MHz or less are combined.

23) The method described in 1) above, wherein the substrate is a semiconductor device substrate.

24) A method of forming a hydrocarbon-containing polymer film on a semiconductor substrate by a capacitively-coupled plasma CVD apparatus, which comprises the steps of: placing a semiconductor device substrate in a CVD reaction chamber, vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C., introducing the vaporized gas and an oxidizing gas such as $CO_2$ gas or a reducing gas such as $H_2$ gas into the CVD reaction chamber inside which the substrate is placed, forming a hard mask comprising a hydrocarbon-containing polymer film on the substrate by plasma polymerizing the gas, and optionally controlling a temperature of the substrate at e.g., about 400° C. or higher while the film is depositing on the substrate.

25) The method described in 24) above, wherein the liquid monomer is cyclic hydrocarbon.

26) The method described in 25) above, wherein the cyclic hydrocarbon is substituted or non-substituted benzene.

27) The method described in 25) above, wherein the substituted or non-substituted benzene is $C_6H_{6-n}R_n$ (wherein n is 0, 1, 2, or 3); R is independently —CH3 or —C2H5, or —CH=CH2.

28) The method described in 27) above, wherein the liquid monomer is a combination of two types or more of substituted or non-substituted benzene.

29) The method described in 25) above, wherein the substituted benzene is any one of 1.3.5-trimethylbenzene, o-xylene, m-xylene or p-xylene.

30) The method described in 25) above, wherein the cyclic hydrocarbon is any one of cyclohexene, cyclohexadiene, cyclooctatetraene, pentane, iso-pentane, or neo-pentane.

31) The method described in 24) above, wherein the liquid monomer is linear hydrocarbon.

32) The method described in 31) above, wherein the linear hydrocarbon is pentane, iso-pentane, neo-pentane, hexane, 1-pentene, 1-hexene, or 1-pentyne.

33) The method described in 24) above, wherein the liquid monomer is hydrocarbon wherein $\gamma$ is equal to zero.

34) The method described in 24) above, wherein only the liquid monomer is used as a reaction gas.

35) The method described in 24) above, wherein the liquid monomer is introduced into a heater disposed upstream of the reaction chamber and vaporized.

36) The method described in 35) above, wherein the liquid monomer is flow-controlled upstream of the heater by a valve, and its introduction into the heater is blocked by a shutoff valve disposed between the flow control valve and the heater and kept approximately at 80° C. or lower or at a temperature lower than that of heating/vaporizing by approximately 50° C. or more except when a film is being formed.

37) The method described in 35) above, wherein the liquid monomer is flow-controlled by a valve, which is disposed upstream of the heater and kept at approximately at 80° C. or lower or at a temperature lower than that of heating/vaporization by approximately 50° C. or more, and its introduction into the heater is blocked except when a film is formed.

38) The method described in 36) or 37) above, wherein the liquid monomer is mixed with an inert gas downstream of the valve and upstream of the heater.

39) The method described in 24) above, further comprising introducing an inert gas into the reaction chamber before the plasma polymerization.

40) The method described in 39) above, wherein the inert gas is one of or a combination of two or more of Ar, He, Ne, Kr, Xe and N2.

41) The method described in 24) above, wherein as an additive gas, an organic gas CnHm (wherein n is an integer of 4 or less including zero; m is any natural number) is further introduced into the reaction chamber.

42) The method described in 24) above, wherein as an additive gas, a dry gas containing N, O and F is further introduced into the reaction chamber.

43) The method described in 24) above, wherein the plasma polymerization step is preformed under the conditions of a substrate temperature of approximately 0° C.—approximately 650° C., a reaction pressure of approximately 10 Pa—approximately 1500 Pa, RF power density of approximately 0.01 W/cm2—approximately 20 W/cm2.

44) The method described in 24) above, wherein the plasma polymerization is preformed using high RF power of 13.56 MHz, 27 MHz, or 60 MHz.

45) The method described in 44) above, wherein one of the high RF power frequencies and a low RF power frequency of 5 MHz or less are combined.

46) A method of forming a hydrocarbon-containing polymer film on a semiconductor substrate by a capacitively-coupled plasma CVD apparatus, which comprises the steps of: introducing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of approximately 20° C.—approximately 350° C. into a heater through a flow control valve and further through a shutoff valve disposed downstream of the flow control valve and kept at approximately 80° C. or lower and vaporizing it, introducing the vaporized gas and an oxidizing gas such as $CO_2$ gas or a reducing gas such as $H_2$ gas into a CVD reaction chamber inside which the substrate is placed, forming a hydrocarbon-containing polymer film on the substrate by plasma polymerizing the gas, and optionally controlling a temperature of the substrate at e.g., about 400° C. or higher while the film is depositing on the substrate.

47) The method described in 46) above, wherein the liquid monomer is mixed with an inert gas downstream of the shutoff valve and upstream of the heater.

48) The method described in 46) above, further comprising shutting off the shutoff valve after completion of film formation to block inflow of the liquid monomer into the heater.

49) The method described in 48) above, wherein after shutting off the shutoff valve, inside the heater is purged by an inert gas.

50) The method described in 46) above, wherein the liquid monomer is cyclic hydrocarbon.

51) The method described in 50) above, wherein the cyclic hydrocarbon is substituted or non-substituted benzene.

52) The method described in 51) above, wherein the substituted or non-substituted benzene is $C_6H_{6-n}R_n$ (wherein n is 0, 1, 2, or 3); R is independently —CH3, —C2H5, or —CH=CH2.

What is claimed is:

1. A method of forming a hydrocarbon-containing polymer film on a semiconductor substrate by a capacitively-coupled plasma CVD apparatus, which comprises:

vaporizing a hydrocarbon-containing liquid monomer ($C_\alpha H_\beta X_\gamma$, wherein $\alpha$ and $\beta$ are natural numbers of 5 or more; $\gamma$ is an integer including zero; X is O, N or F) having a boiling point of about 20° C. to about 350° C. which is not substituted by a vinyl group or an acetylene group;

introducing said vaporized gas and $CO_2$ gas or $H_2$ gas into a CVD reaction chamber inside which a substrate is placed; and forming a hydrocarbon-containing polymer film on said substrate by plasma polymerization of said gas and controlling an extinction coefficient at 193 nm and a mechanical hardness of the forming hydrocarbon-containing polymer film at 0.38 or less and 0.5 GPa or higher, respectively, as a function of a flow rate of the $CO_2$ gas or $H_2$ gas.

2. The method according to claim 1, wherein the flow rate of the $CO_2$ gas or $H_2$ gas is greater than a flow rate of the vaporized gas.

3. The method according to claim 2, wherein the $CO_2$ gas is used at a flow rate of 800 sccm or more.

4. The method according to claim 1, wherein the $CO_2$ gas is used at a flow rate of 350 sccm or more.

5. The method according to claim 1, wherein the $H_2$ gas is used at a flow rate of 200 sccm or more.

6. The method according to claim 5, wherein the $H_2$ gas is used at a flow rate of 300 sccm or more.

7. The method according to claim 1, wherein the extinction coefficient and the mechanical hardness of the forming hydrocarbon-containing polymer film are controlled at 0.35 or less and 0.8 GPa or higher, respectively, as a function of the flow of the $CO_2$ gas or $H_2$ gas.

8. The method according to claim 1, wherein the extinction coefficient and the mechanical hardness of the forming hydrocarbon-containing polymer film are controlled further as a function of a temperature of the substrate.

9. The method according to claim 8, wherein the temperature is controlled at 400° C. or higher.

10. The method according to claim 1, wherein said liquid monomer is a cyclic hydrocarbon.

11. The method according to claim 10, wherein said cyclic hydrocarbon is a substituted or non-substituted benzene.

12. The method according to claim 11, wherein said substituted or non-substituted benzene is $C_6H_{6-n}R_n$ (wherein n is 0, 1, 2, or 3); R is independently —CH3 or —C2H5.

13. The method according to claim 12, wherein said substituted benzene is any one of 1,3,5-trimethylbenzene, o-xylene, m-xylene or p-xylene.

14. The method according to claim 1, wherein said liquid monomer is a linear hydrocarbon.

15. The method according to claim 1, wherein said liquid monomer is a hydrocarbon wherein γ is equal to zero.

16. The method according to claim 1, wherein only said liquid monomer is used as a reaction gas.

17. The method according to claim 1, wherein said liquid monomer is introduced into a heater disposed upstream of said reaction chamber and vaporized.

18. The method according to claim 17, wherein said liquid monomer is flow-controlled upstream of said heater by a valve, and its introduction into said heater is blocked, except when a film is being formed, by a shutoff valve disposed between said flow control valve and said heater and kept approximately at 80° C. or lower or at a temperature which is at least approximately 50° C. lower than that of vaporization by heat.

19. The method according to claim 17, wherein said liquid monomer is flow-controlled by a valve, which is disposed upstream of said heater and kept at approximately 80° C. or lower or at a temperature which is at least approximately 50° C. lower than that of vaporization by heat, and its introduction into said heater is blocked except when a film is being formed.

20. The method according to claim 1, further comprising introducing an inert gas into the reaction chamber prior to the plasma polymerization.

21. The method according to claim 1, wherein as an additive gas, an organic gas CnHm (wherein n is an integer of 4 or less including zero; m is any natural number) is further introduced into the reaction chamber.

22. The method according to claim 1, wherein as an additive gas, a dry gas containing N, O and F is further introduced into the reaction chamber.

23. A method of forming a hydrocarbon-containing polymer film on a semiconductor substrate by a capacitively-coupled plasma CVD apparatus, which comprises the steps of:
   placing a semiconductor device substrate in a CVD reaction chamber;
   vaporizing a hydrocarbon-containing liquid monomer ($C_\alpha H_\beta X_\gamma$, wherein α and β are natural numbers of 5 or more; γ is an integer including zero; X is O, N or F) having a boiling point of about 20° C. to about 350° C.;
   introducing said vaporized gas and $CO_2$ gas or $H_2$ gas into the CVD reaction chamber inside which the substrate is placed; and
   forming a hard mask comprising a hydrocarbon-containing polymer film on said substrate by plasma polymerization of said gas and controlling an extinction coefficient at 193 nm and a mechanical hardness of the forming hydrocarbon-containing polymer film at 0.38 or less and 0.5 GPa or higher, respectively, as a function of a flow rate of the $CO_2$ gas or $H_2$ gas.

24. The method according to claim 23, wherein the flow rate of the $CO_2$ gas or $H_2$ gas is greater than a flow rate of the vaporized gas.

25. The method according to claim 23, wherein the $CO_2$ gas is used at a flow rate of 350 sccm or more.

26. The method according to claim 25, wherein the $CO_2$ gas is used at a flow rate of 800 sccm or more.

27. The method according to claim 25, wherein the extinction coefficient and the mechanical hardness of the forming hydrocarbon-containing polymer film are controlled further as a function of a temperature of the substrate.

28. The method according to claim 27, wherein the temperature is controlled at 400° C. or higher.

29. The method according to claim 23, wherein the $H_2$ gas is used at a flow rate of 200 sccm or more.

30. The method according to claim 29, wherein the $H_2$ gas is used at a flow rate of 300 sccm or more.

31. The method according to claim 23, wherein the extinction coefficient and the mechanical hardness of the forming hydrocarbon-containing polymer film are controlled at 0.35 or less and 0.8 GPa or higher, respectively, as a function of the flow of the $CO_2$ gas or $H_2$ gas.

32. The method according to claim 23, wherein said liquid monomer is a cyclic hydrocarbon.

33. The method according to claim 32, wherein said cyclic hydrocarbon is a substituted or non-substituted benzene.

34. The method according to claim 23, wherein said liquid monomer is a linear hydrocarbon.

35. The method according to claim 23, wherein said liquid monomer is a hydrocarbon wherein γ is equal to zero.

36. The method according to claim 23, wherein only said liquid monomer is used as a reaction gas.

37. The method according to claim 23, wherein said liquid monomer is introduced into a heater disposed upstream of the reaction chamber and vaporized.

38. The method according to claim 37, wherein said liquid monomer is flow-controlled upstream of said heater by a valve, and its introduction into said heater is blocked, except when a film is being formed, by a shutoff valve disposed between said flow control valve and said heater and kept approximately at 80° C. or lower or at a temperature which is at least approximately 50° C. lower than that of vaporization by heat.

39. The method according to claim 37, wherein said liquid monomer is flow-controlled by a valve, which is disposed upstream of said heater and kept at approximately at 80° C. or lower or at a temperature which is at least approximately 50° C. lower than that of vaporization by heat, and its introduction into said heater is blocked except when a film is being formed.

40. The method according to claim 23, further comprising introducing an inert gas into the reaction chamber prior to the plasma polymerization.

* * * * *